United States Patent [19]
Derhacobian et al.

[11] Patent Number: 6,143,612
[45] Date of Patent: Nov. 7, 2000

[54] HIGH VOLTAGE TRANSISTOR WITH HIGH GATED DIODE BREAKDOWN, LOW BODY EFFECT AND LOW LEAKAGE

[75] Inventors: Narbeh Derhacobian, Belmont; Pau-ling Chen, Saratoga; Hao Fang, Cupertino; Timothy Thurgate, Sunnyvale, all of Calif.

[73] Assignee: Advanced Micro Devices, Inc., Sunnyvale, Calif.

[21] Appl. No.: 09/172,090

[22] Filed: Oct. 14, 1998

[51] Int. Cl.$^7$ .................................................. H01L 21/336
[52] U.S. Cl. .......................... 438/289; 438/302; 438/305; 438/298; 438/450; 438/546; 438/291
[58] Field of Search ..................................... 438/289, 298, 438/291, 450, 302, 305, 546, 551

[56] References Cited

U.S. PATENT DOCUMENTS

| | | | |
|---|---|---|---|
| 4,895,520 | 1/1990 | Berg | 438/289 |
| 4,994,407 | 2/1991 | Custode et al. | 438/227 |
| 5,004,701 | 4/1991 | Motokawa | 438/450 |
| 5,091,324 | 2/1992 | Hsu et al. | 438/200 |
| 5,518,941 | 5/1996 | Lin et al. | 438/291 |
| 5,688,706 | 11/1997 | Tseng | 438/289 |

*Primary Examiner*—Carl Whitehead, Jr.
*Assistant Examiner*—Khanh Duong

[57] ABSTRACT

A high voltage transistor exhibiting high gated diode breakdown voltage, low leakage and low body effect is forced while avoiding an excessive number of costly masking steps. Embodiments include providing a high gated diode breakdown voltage by masking the high voltage junctions from the conventional field implant, masking the source/drain regions from the conventional threshold adjust implant, and employing a very lightly doped n-type implant in lieu of conventional n+ and LDD implants. Appropriate openings are formed in the field implant blocking mask so that the field implant occurs at the edges of the junctions, thus achieving low leakage. The field implant blocking mask is extended over the channel area, thereby producing a transistor with low body effect.

15 Claims, 8 Drawing Sheets

FIG. 1A
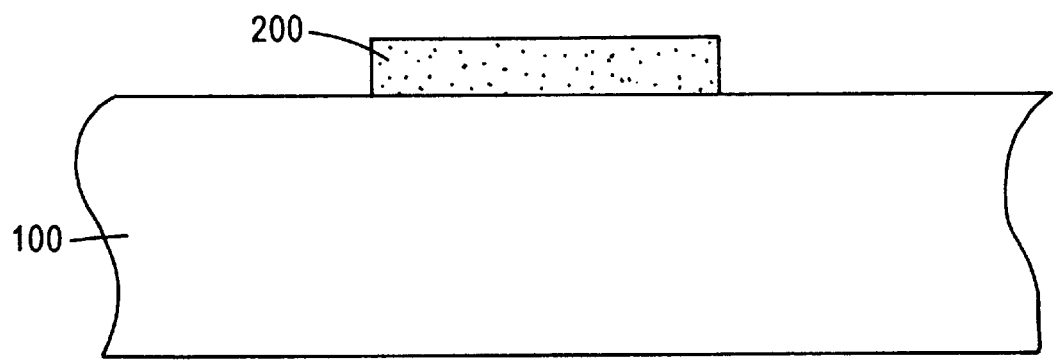
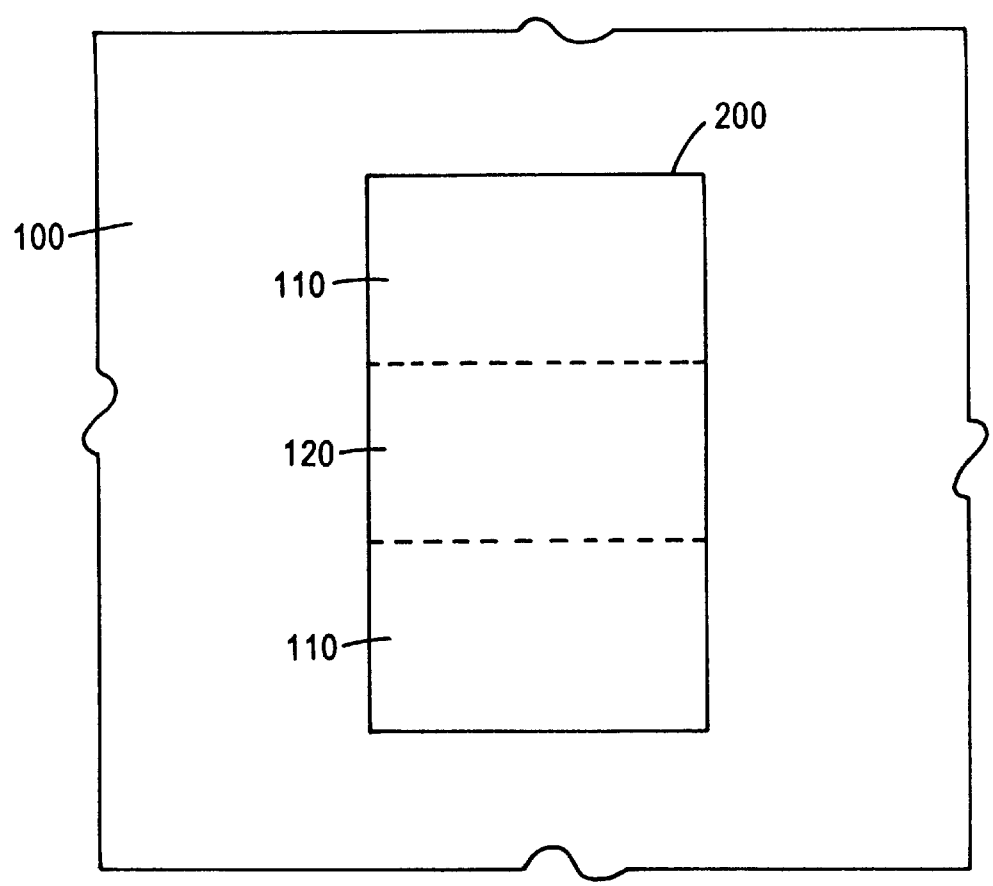
FIG. 1B

HIGH VOLTAGE TRANSISTOR WITH HIGH GATED DIODE BREAKDOWN, LOW BODY EFFECT AND LOW LEAKAGE

RELATED APPLICATIONS

This application contains subject matter related to subject matter disclosed in copending U.S. patent application Ser. No. 09/177,817 (Attorney Docket No. 50100-522) and U.S. patent application Ser. No. 09/182,525 (Attorney Docket No. 50100-554).

FIELD OF THE INVENTION

The present invention relates to a method of manufacturing a high-voltage transistor on a semiconductor substrate. The present invention has particular applicability in manufacturing nonvolatile semiconductor memory devices requiring a high programming voltage.

BACKGROUND ART

Conventional nonvolatile semiconductor memories, such as flash electrically erasable programmable read only memories (Flash EEPROMs), typically comprise a floating gate memory cell, which includes a source region, a drain region and a channel region formed in a semiconductor substrate, and a floating gate formed above the substrate between the channel region and a control gate. One method of programming or erasing a floating gate memory cell, utilizing a phenomenon known as Fowler-Nordheim tunneling, comprises applying a voltage differential, such as about 16 volts to about 23 volts, to the control gate while the channel region is kept at a low voltage, such as about 0 volts to about 2 volts, to force electrons into the floating gate. This movement of electrons is referred to as programming, and the high voltage (i.e., about 16 to about 23 volts) applied to the control gate is known as program voltage. A similar method is employed to erase the memory cell by reversing the direction of bias to force the electrons out of the floating gate.

Flash memory systems conventionally comprise a two-dimensional array of floating gate memory cells. One such array architecture is called NAND architecture, which typically includes several strings, known as NAND strings, of floating gate memory transistors, each transistor coupled to the next transistor in the string by coupling the source of one device to the drain of the next device to form bit lines. A plurality of word lines, perpendicular to the NAND strings, each connect to the control gate of one memory cell of each NAND string.

To supply program voltage on demand to each of the word lines, a CMOS transistor referred to as a "row selector" is employed at one end of each word line. The drain junction of this row-selecting transistor must be able to handle voltages of about 20 volts or higher, typically under gated diode conditions (i.e., with gate grounded). Additionally, in order to attain an acceptable level of performance and reliability, it must exhibit high gated diode breakdown voltage characteristics to avoid junction breakdown, low leakage from drain to source, and a low body effect so that its threshold voltage is not excessively high. Conventional processing techniques require many separate photolithographic masking steps to manufacture this transistor. The large number of masking steps raises the production cost of the Flash memory device and increases the probability of defects in the finished device.

There exists a need for simplified methodology in manufacturing a high voltage, high performance transistor with fewer processing steps, thereby reducing, manufacturing costs and increasing production throughput.

SUMMARY OF THE INVENTION

An advantage of the present invention is a simplified method of manufacturing a high voltage transistor which exhibits high gated diode breakdown voltage, low leakage and low body effect.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, which method comprises isolating a substantially rectilinear active area on a main surface of a semiconductor substrate, the active area comprising a first source/drain region and a second source/drain region, each having a source/drain width and a source/drain length, separated by a channel region having opposing ends not abutting either of the source/drain regions along the source/drain length; providing a field implant blocking mask covering the first source/drain region and extending over the channel region, the field implant blocking mask having a pair of substantially rectangular notches, each notch protruding into the channel region a predetermined distance along the source/drain width from one of the opposing ends of the channel region; implanting impurities to form a field implant in the substrate; forming a gate oxide layer over the channel region, providing a threshold voltage implant blocking mask over the first source/drain region; implanting impurities to form a threshold adjust implant in the substrate; forming a gate on the gate oxide layer; and implanting impurities to form a lightly doped junction implant in the substrate.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein:

FIGS. 1A–1B are a cross-sectional view and a top view, respectively, of a phase of a method in accordance with an embodiment of the present invention.

DESCRIPTION OF THE INVENTION

Figure 2:
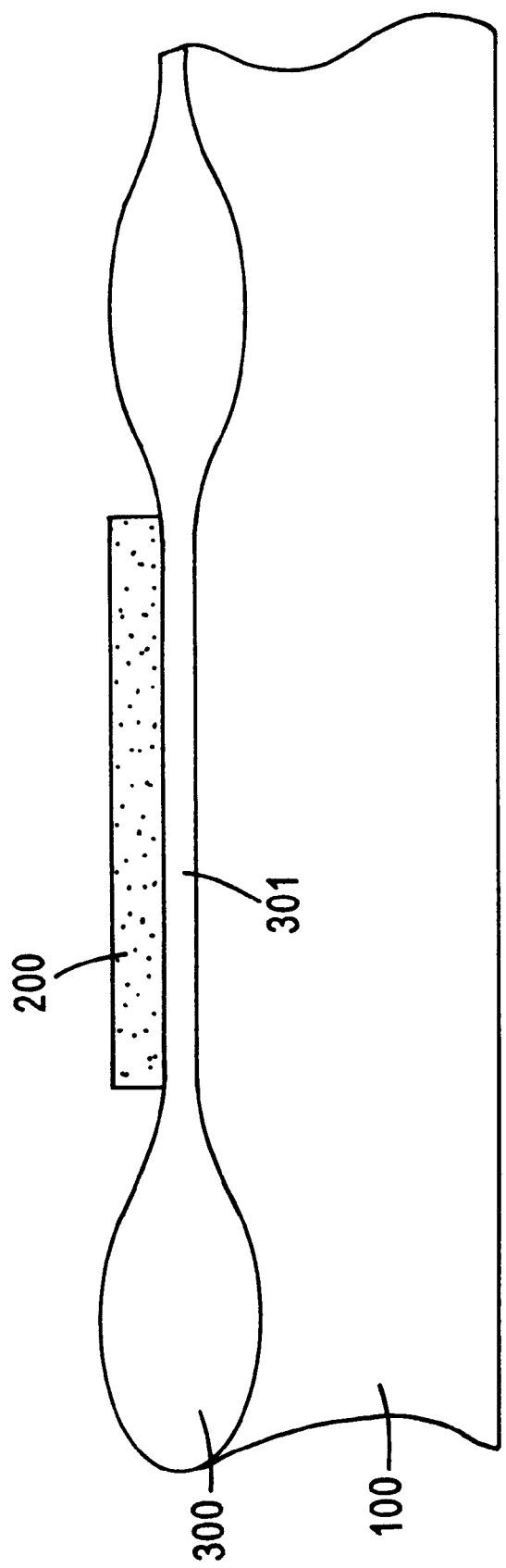
FIG. 2 is a cross-sectional view of a phase of a method in accordance with an embodiment of the present invention.

Conventional methodologies for manufacturing high voltage transistors with a high gated diode breakdown voltage, low leakage and low body effect employ a large number of photoresist masking steps, which increases the cost of the finished device and reduces manufacturing yield. The present invention addresses and solves these problems stemming from conventional complex manufacturing processes.

In typical CMOS transistor manufacturing processes, active regions where source/drain and channel areas are to be formed are electrically isolated by the formation of a field oxide at the surface of a semiconductor substrate, and implantation of the substrate under the field oxide with impurities, such as boron. As used throughout the present disclosure and claims, the term "substrate" denotes a semiconductor substrate or an epitaxial layer formed on the semiconductor substrate. The isolated active regions are subdivided into source/drain and channel areas by further implantation of impurities. A gate oxide layer is then formed, followed by a threshold implant, such as p-type boron, through the gate oxide into the substrate to adjust the turn-on characteristics of the devices. After formation of gates above the channel regions, further implants are performed into the source/drain areas, such as a lightly-doped drain (LDD) implant followed by a relatively heavy n+ implant, such as arsenic at a dosage of $1 \times 10^{13}$ atoms $cm^{-2}$.

According to the methodology of the present invention, a high voltage CMOS transistor, such as an n-channel transistor, with a high gated diode breakdown voltage, low leakage and low body effect is formed by lightly doping the junction or junctions of the transistor which are required to handle high voltage (hereinafter referred to as the high voltage junctions) with an n-type impurity, while avoiding unnecessary implantation of p-type impurities into the high voltage junction or junctions, using a minimum number of masking steps.

The characteristic of gated diode breakdown voltage is measured by applying zero bias to the transistor's gate and applying a voltage to the drain (i.e., reverse biasing the transistor so no current should flow) until the drain junction breaks down and current begins to flow. Conventional CMOS transistors typically have a maximum gated diode breakdown voltage of about 17 volts. However, the row selector transistor of a NAND Flash memory requires a gate diode breakdown voltage of greater than 20 volts; e.g., about 20–23 volts. The inventive method achieves the required high gated diode breakdown voltage by masking the high voltage junctions from the field implant, masking the source and drain regions from the threshold adjust implant, and substituting a very lightly doped n-type implant, such as phosphorus at a dosage of about $1 \times 10^{11}$ atoms $cm^{-2}$ to about $1 \times 10^{13}$ for the n+ and LDD implants.

The leakage characteristic of a transistor is an indication of its ability to shut off, measured by placing zero bias on the gate and a voltage lower than but close to the breakdown voltage on the junction, and noting the current flow from the drain to the source. Any leakage tends to occur at the edges of the transistor's source/drain regions where they border the channel region, and will increase if there is no field implant at these areas. Therefore, the inventive methodology provides for appropriate openings in the mask protecting the high voltage junctions from the field implant, to implement a field implant at the edges of the junctions. Thus, a transistor manufactured according to the present invention exhibits low leakage.

Transistor body effect is a phenomenon whereby the threshold voltage (i.e., turn on voltage) of a transistor increases substantially in the presence of a slight bias on the substrate or source. Body effect is reduced significantly if there is no field implant in the channel area. Therefore, the field implant blocking mask of the inventive method extends over the channel area, thereby producing a transistor with low body effect.

An embodiment of the present invention is illustrated in FIGS. 1A–8B, wherein sequential phases in forming a semiconductor device in accordance with the present invention are depicted. Referring to FIGS. 1A–1B, substrate 100 is prepared having a substantially planar surface, typically a semiconductor substrate comprising doped monocrystalline silicon or an epitaxial layer formed on a semiconductor substrate in accordance with conventional practices. A photoresist mask 200 is then formed on substrate 100 to protect the areas where device regions are to be formed, called the "active areas". The area shown in FIG. 1B which is protected by mask 200 is substantially rectilinear and comprises source/drain regions 110 separated by a channel region 120, where the source/drain regions and channel of a high voltage transistor are to be formed according to the present invention. A field oxide 300 is grown surrounding the active areas 110, 120, as depicted in FIG. 2, as by Local Oxidation of Silicon (LOCOS) by heating the substrate 100 while its unprotected regions are exposed to as an oxidizing gas as, such as oxygen. Despite the provision of mask 200, a thin oxide layer 301 grows under mask 200 during the LOCOS process.

Figure 3A:
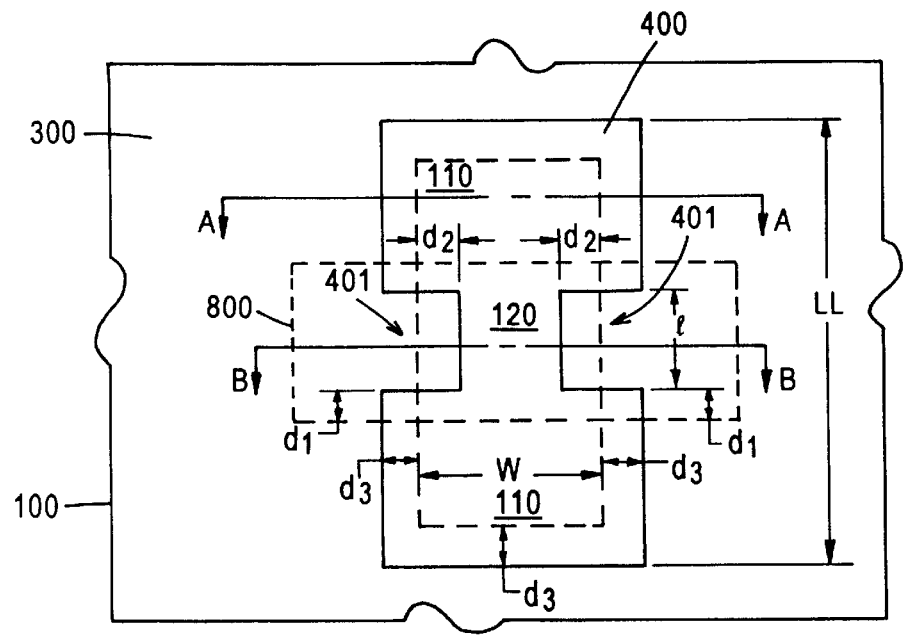
FIG. 3A is a top view of a phase of a method in accordance with an embodiment of the present invention.
Figure 3B:
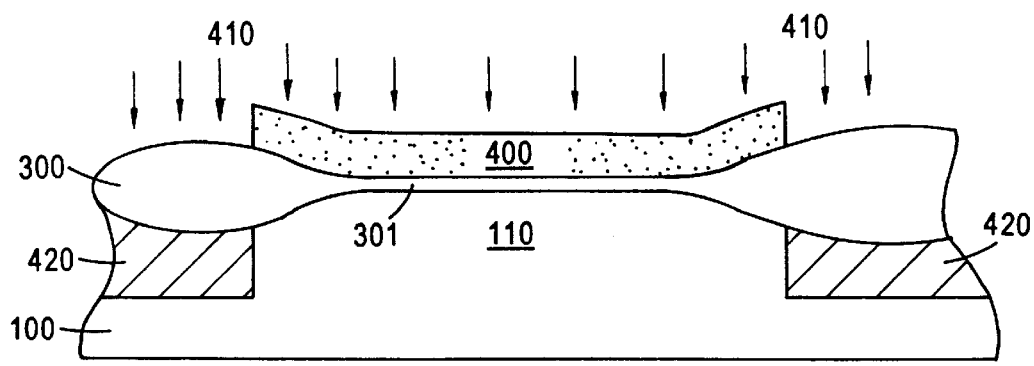
FIG. 3B is a cross-sectional view taken along the line A—A in FIG. 3A.
Figure 3C:
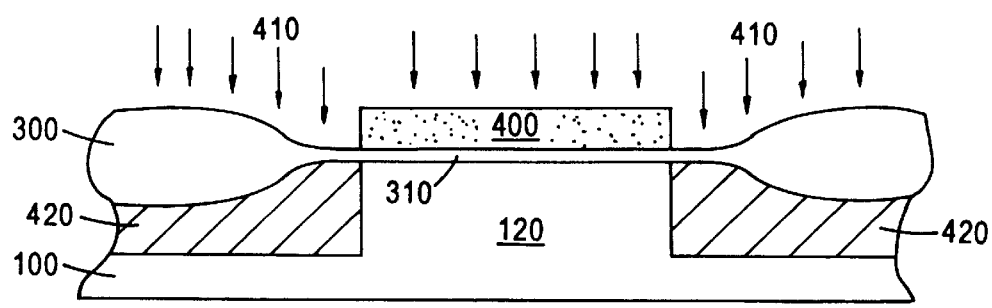
FIG. 3C is a cross-sectional view taken along the line B—B in FIG. 3A.

After removal of mask 200, a photoresist field implant blocking mask 400 is formed, as depicted in FIGS. 3A–3C, over the source/drain regions 110. For exemplary purposes, the figures show both source/drain areas 110 as high voltage junctions. However, the present method may be practiced even if one of the pair of source/drain areas 110 is a high voltage junction and the other is not (e.g., if one source/drain region 110 will always be grounded), in which case field implant blocking mask 400 would be formed over the area 110 which is to handle high voltage, and not over the other area 110.

Field implant blocking mask 400 also extends over channel region 120 and has a pair of substantially rectangular notches 401 each of which has a notch length l such that mask 400 extends a distance $d_1$ onto channel region 120 corresponding to a region under opposing edges of subsequently formed gate 800 along the length LL of source/drain regions 110, and protrudes into channel region 120 a distance $d_2$ along a width W of source/drain regions 110. Distance $d_1$ is about 1.5 μm or less. Distance $d_2$ is about 1.0 μm or less depending on the width of source/drain regions 110. Mask 400 also preferably extends from the edges of source/drain regions 110; i.e., the edge remote from channel region 120 and the opposing sides of each source/drain area 110, onto field oxide 300 a distance $d_3$, about 1.5 μm or less.

As shown in FIGS. 3B and 3C, impurities 410 are implanted through field oxide 300 and channel region 120 to form the field implant 420, such as boron at a dosage of about $1\times10^{12}$ atoms cm$^{-2}$ to about $1\times10^{13}$ atoms cm$^{-2}$ and at an energy of about 80 kev to about 300 keV. This impurity implantation enhances the high-voltage transistor's field isolation and reduces leakage at the edges of source/drain regions 110 where they border channel region 120. However, the transistor's gated diode breakdown voltage is raised by blocking field implant 420 from source/drain regions 110 with mask 400, and its body effect is reduced by blocking field implant 420 from most of channel region 120 with mask 400.

Figure 4:
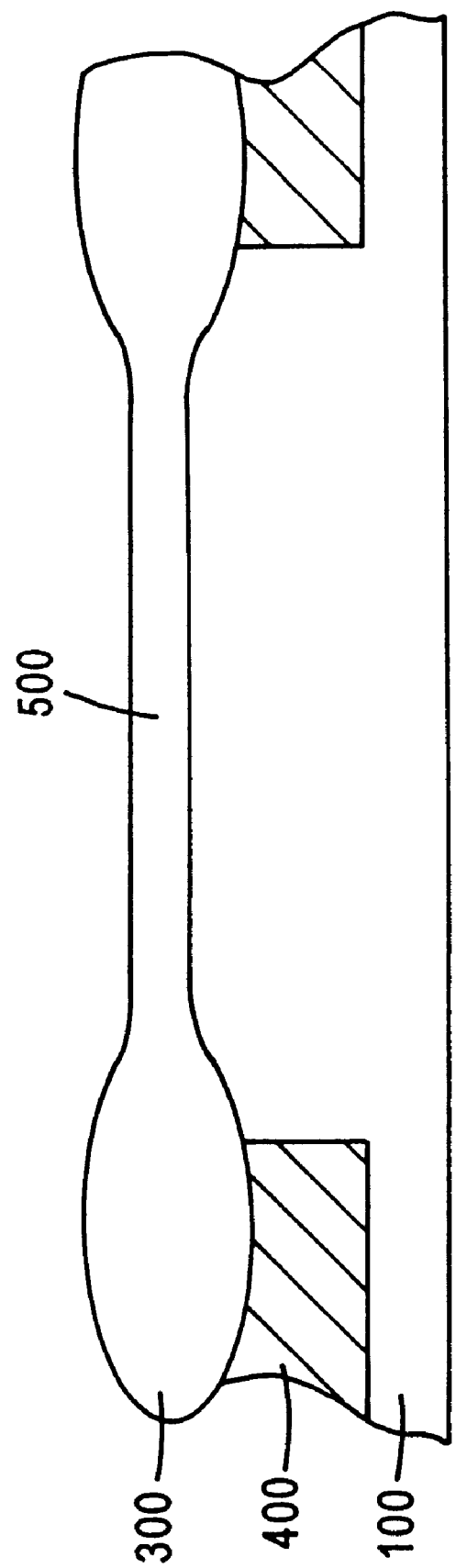
FIG. 4 is a cross-sectional view of a phase of a method in accordance with an embodiment of the present invention.

Thereafter, as depicted in FIG. 4, a gate oxide layer 500 is formed over channel region 120, as by thermal oxidation, to a thickness of about 250 Å to about 450 Å.

Figure 5A:
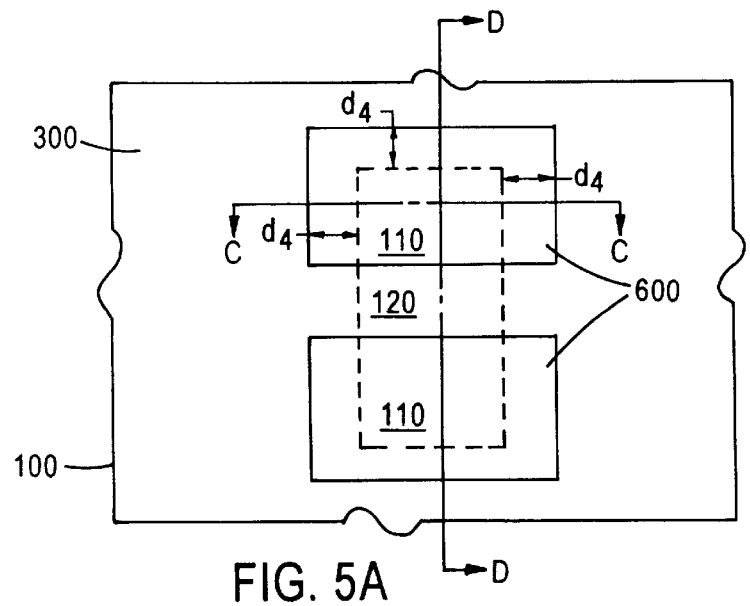
FIG. 5A is a top view of a phase of a method in accordance with an embodiment of the present invention.
Figure 5B:
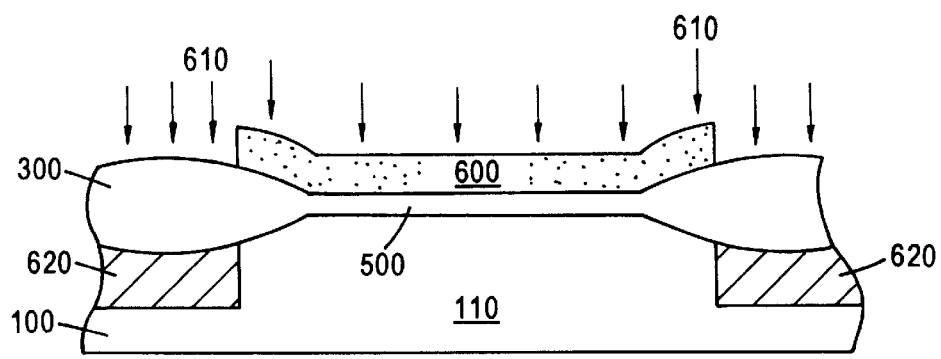
FIG. 5B is a cross-sectional view taken along the line C—C in FIG. 5A.
Figure 5C:
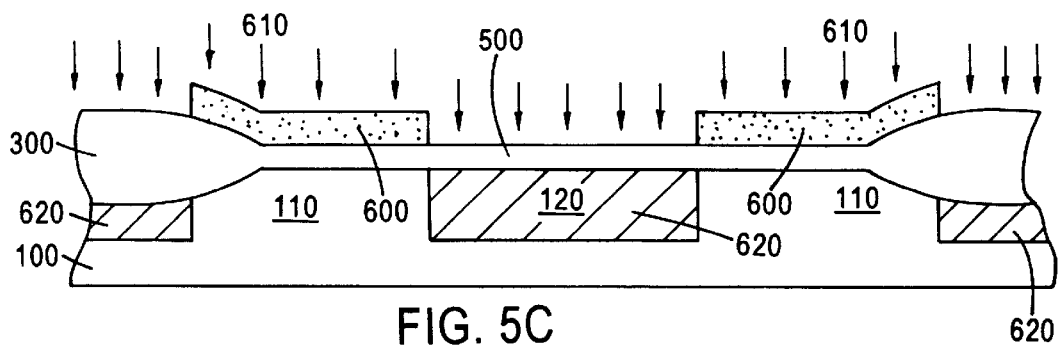
FIG. 5C is a cross-sectional view taken along the line D—D in FIG. 5A.
Figure 6:
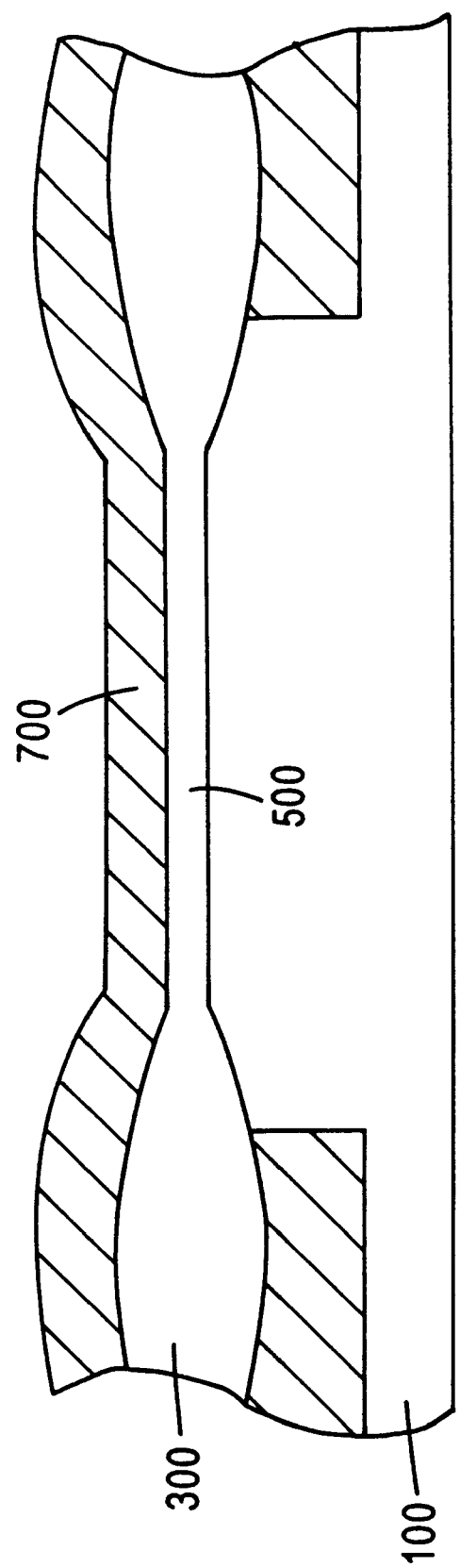
FIG. 6 is a cross-sectional view of a phase of a method in accordance with an embodiment of the present invention.
Figure 7A:
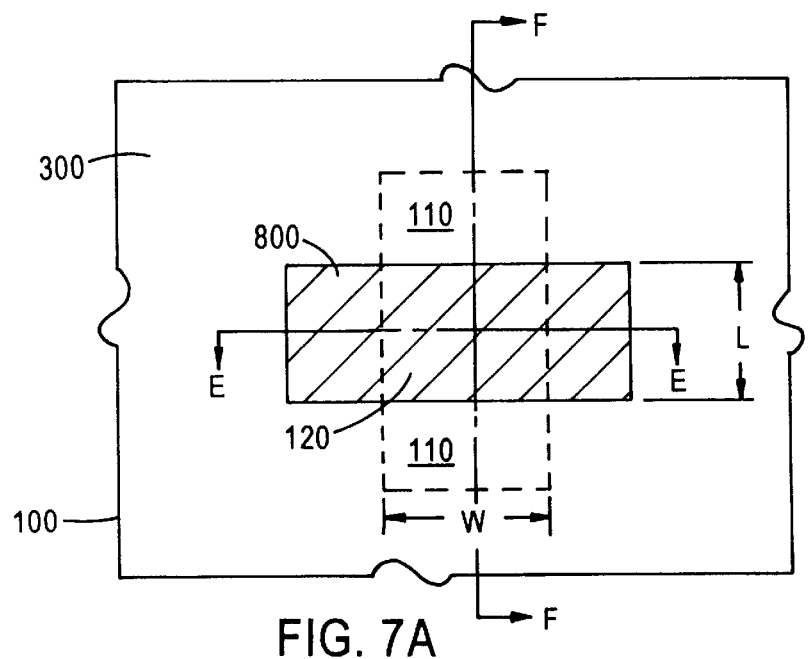
FIG. 7A is a top view of a phase of a method in accordance with an embodiment of the present invention.
Figure 7B:
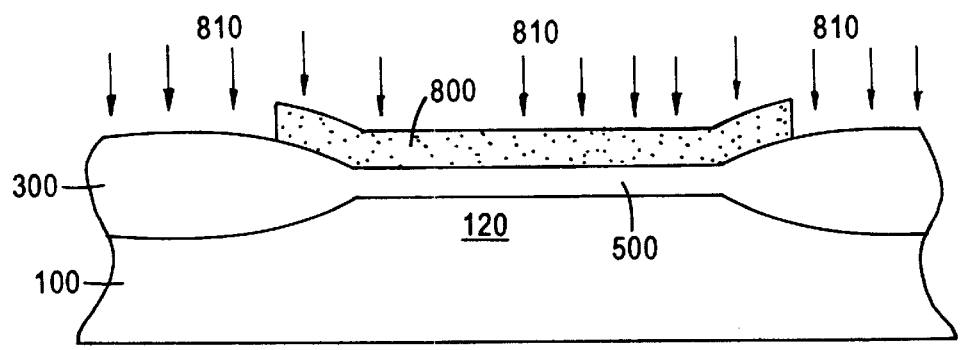
FIG. 7B is a cross-sectional view taken along the line E—E in FIG. 7A.
Figure 7C:
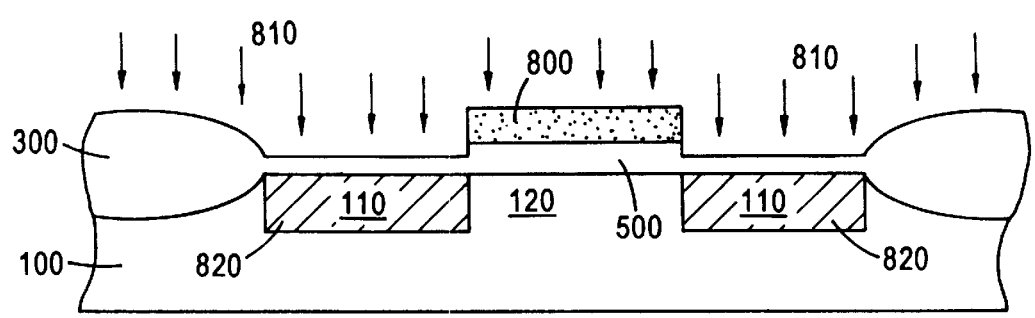
FIG. 7C is a cross-sectional view taken along the line F—F in FIG. 7A.

Next, referring to FIGS. 5A–5C, a photoresist threshold voltage implant blocking mask 600 is formed over each source/drain region 110, typically extending from the distal end and opposing sides of each source/drain region 110 onto field oxide 300 a distance $d_4$, about 1.5 μm or less. Impurities 610 are then implanted through field oxide 300 and channel region 120 to form the threshold adjust implant 620, such as boron at a dosage of about $0.5\times10^{11}$ atoms cm$^{-2}$ to about $1\times10^{13}$ atoms cm$^{-2}$ and at an energy of about 20 kev to about 100 keV. As discussed above, if only one of the pair of source/drain areas 110 is a high voltage junction, threshold voltage implant blocking mask 600 would be formed over the area 110 which is to handle high voltage, and not over the other source/drain area 110. Threshold adjust implant 620 controls the transistor's turn-on voltage. However, the transistor's gated diode breakdown voltage is raised since it is blocked from source/drain regions 110 by mask 600.

Referring now to FIGS. 6 and 7A–7C, a gate 800 having a length L is formed over channel region 120, as by a polysilicon-based gate formation process, such as by depositing, masking and etching a composite layer 700 comprising a layer of polysilicon about 1200 Å thick, a layer of tungsten suicide about 1000 Å to about 2000 Å thick and a layer of silicon oxynitride about 1000 Å to about 2000 Å thick.

A blanket implant 810 is then performed, such as phosphorus at a dosage of about $1\times10^{11}$ atoms cm$^{-2}$ to about $1\times10^{13}$ atoms cm$^{-2}$ and at an energy of about 20 keV to about 80 keV, to form a lightly doped junction implant 820 in source/drain areas 110. This implant replaces the LDD implant and heavy n+ implant of conventional transistors, raising the gated diode breakdown voltage of the transistor produced by the inventive method.

Figure 8A:
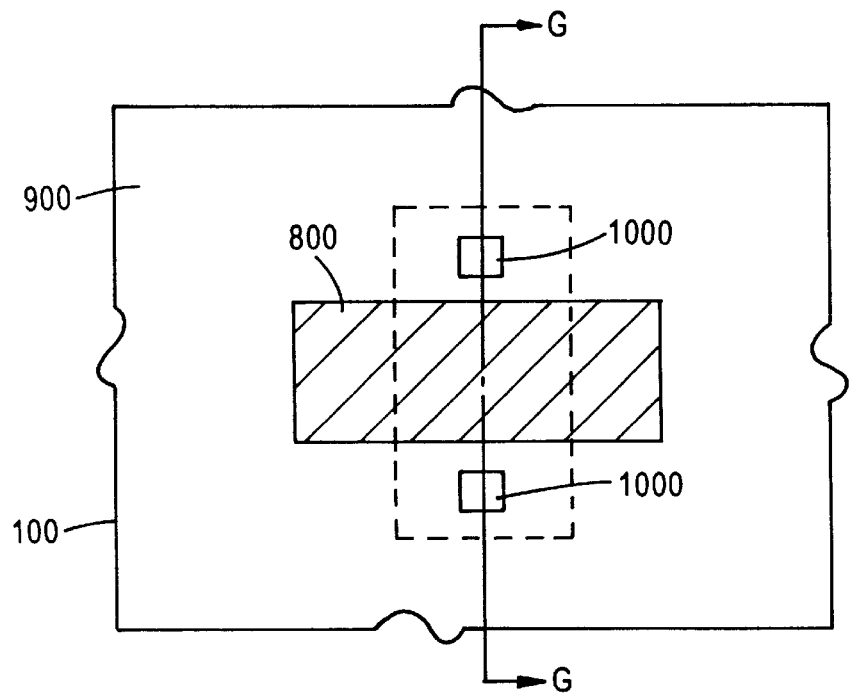
FIG. 8A is a top view of a phase of a method in accordance with an embodiment of the present invention.
Figure 8B:
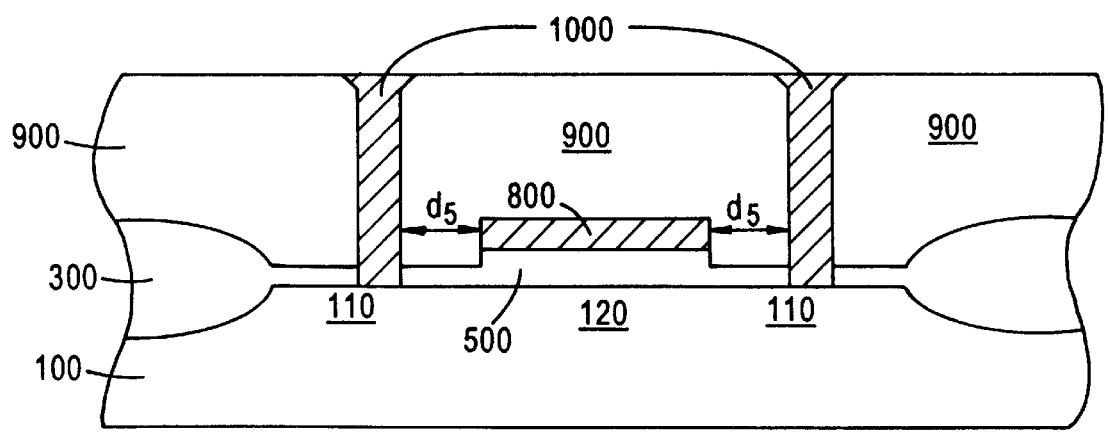
FIG. 8B is a cross-sectional view taken along the line G—G in FIG. 8A.

As depicted in FIGS. 8A–8B, after standard process steps are completed (e.g., implants for other transistors to be formed on substrate 100), a dielectric layer 900 is deposited and contacts 1000 are formed from an upper surface of dielectric layer 900 to source/drain regions 110, using conventional techniques. In forming to produce a transistor with a high gated diode breakdown voltage, it is desirable to maintain a low doping concentration under the transistor gate. Therefore, contacts 1000 are spaced apart a distance $d_5$ of at least about 0.4 μm from the edge of gate 800, so that a subsequently performed contact implant, which is typically done at a high dosage, does not diffuse excessively under gate 800.

A high-voltage transistor produced according to the inventive method, where the width W of source/drain regions 110 is about 20 μm and the length L of gate 800 is about 20 μm (see FIG. 7A), will typically exhibit a gated diode breakdown voltage of about 20 volts to about 35 volts. Its leakage current at room temperature at a drain voltage of about 20 volts will be less than or about equal to 10 pA. This transistor will also typically exhibit a low body effect; i.e., a linear threshold voltage of about 0.4 volts to about 0.7 volts at a drain voltage of about 0.1 volts, a source voltage of about 0 volts, and a substrate voltage of about 0 volts, and a linear threshold voltage of about 0.6 volts to about 1.0 volts at a drain voltage of about 0.1 volts, a source voltage of about 0 volts, and a substrate voltage of about −3.0 volts.

The inventive method achieves a high gated diode breakdown voltage by masking the high voltage junctions, (i.e., areas where source/drain regions 110 abut channel region 120) from field implant 410 with mask 400, masking source/drain regions 110 from threshold adjust implant 610 with mask 600, and employing a very lightly doped n-type implant 810 in lieu of conventional n+ and LDD implants. At the same time, the inventive methodology provides appropriate openings in field implant blocking mask 400 to form a field implant 420 at the edges of the junctions, thereby enabling the manufacture of a transistor which exhibits low leakage. Furthermore, field implant blocking mask 400 extends over channel area 120, thereby producing a transistor with low body effect. The present invention is applicable to the manufacture of various types of high-voltage semiconductor devices, particularly high-density semiconductor devices having a design rule of about 0.25 μ and under; e. g., about 0.18 μm and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the invention is capable of use in various other combinations and environments and is capable of changes or modifications within the scope of the inventive concept as expressed therein.

What is claimed is:

1. A method of manufacturing a semiconductor device, which method comprises:

isolating a substantially rectilinear active area on a main surface of a semiconductor substrate, the active area comprising a first source/drain region and a second source/drain region, each having a source/drain width and a source/drain length, separated by a channel region having opposing ends not abutting either of the source/drain regions along the source/drain length;

providing a field implant blocking mask covering the first source/drain region and extending over the channel region, the field implant blocking mask having a pair of substantially rectangular notches, each notch protruding into the channel region a predetermined distance along the source/drain width from one of the opposing ends of the channel region;

implanting impurities to form a field implant in the substrate;

forming a gate oxide layer over the channel region, providing a threshold voltage implant blocking mask over the first source/drain region;

implanting impurities to form a threshold adjust implant in the substrate;

forming a gate on the gate oxide layer; and implanting impurities to form a lightly doped junction implant in the substrate.

2. The method according to claim 1, comprising isolating the active area by providing a photoresist mask corresponding to the active area on the main surface of the substrate and forming a field oxide surrounding the active area.

3. The method according to claim 1, wherein the predetermined distance of the notches in the field implant blocking mask is about 1.0 $\mu$m or less.

4. The method according to claim 2, wherein the field implant blocking mask extends from the distal end of the first source/drain region a first distance onto the field oxide and extends from opposing sides of the first source/drain region a second distance from each opposing side onto the field oxide.

5. The method according to claim 4, wherein the first distance and the second distance are about 1.5 $\mu$m or less.

6. The method according to claim 1, comprising implanting boron at a dosage of about $1 \times 10^{12}$ atoms cm$^{-2}$ to about $1 \times 10^{13}$ atoms cm$^{-2}$ and at an energy of about 80 kev to about 300 keV to form the field implant.

7. The method according to claim 1, wherein the gate oxide layer has a thickness of about 250 Å to about 450 Å.

8. The method according to claim 1, wherein the threshold implant blocking mask extends from the distal end of the first source/drain region a third distance onto the field oxide and extends from opposing sides of the first source/drain region a fourth distance from each opposing side onto the field oxide.

9. The method according to claim 8, wherein the third distance and the fourth distance are about 1.5 $\mu$m or less.

10. The method according to claim 1, comprising implanting boron at a dosage of about $0.5 \times 10^{11}$ atoms cm$^{-2}$ to about $1 \times 10^{13}$ atoms cm$^{-2}$ and at an energy of about 20 kev to about 100 kev to form the threshold adjust implant.

11. The method according to claim 1, comprising providing each of the notches in the field implant blocking mask with a notch length along the source/drain length such that the field implant blocking mask extends onto the channel region a fifth distance along the source/drain length corresponding to a region under an edge of the gate.

12. The method according to claim 11, wherein the fifth distance is about 1.5 $\mu$m or less.

13. The method according to claim 1, comprising implanting phosphorus at a dosage of about $1 \times 10^{11}$ atoms cm$^{-2}$ to about $1 \times 10^{13}$ atoms cm$^{-2}$ at an energy of about 20 keV to about 80 keV to form the junction implant.

14. The method according to claim 1, comprising, subsequent to forming the junction implant:

depositing a dielectric layer on the gate and the field oxide; and forming a contact from an upper surface of the dielectric layer to the first source/drain region, the contact being spaced apart from an edge of the gate at least about 0.4 $\mu$m.

15. The method according to claim 1, comprising providing the field implant blocking mask and the threshold voltage implant blocking mask over the second source/drain area.

* * * * *